(12) United States Patent
Fleischer et al.

(10) Patent No.: US 8,188,761 B2
(45) Date of Patent: *May 29, 2012

(54) SOFT ERROR DETECTION FOR LATCHES

(75) Inventors: Bruce M. Fleischer, Bedford Hills, NY (US); Michael K. Gschwind, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/026,472

(22) Filed: Feb. 14, 2011

(65) Prior Publication Data

US 2011/0221473 A1    Sep. 15, 2011

Related U.S. Application Data

(63) Continuation of application No. 12/723,189, filed on Mar. 12, 2010, now Pat. No. 7,977,965.

(51) Int. Cl.
*H03K 19/003* (2006.01)

(52) U.S. Cl. ............... 326/9; 326/12; 326/95; 327/208; 327/218

(58) Field of Classification Search ............... 326/8–16, 326/93–98; 327/200–218
See application file for complete search history.

(56) References Cited

U.S. PATENT DOCUMENTS

| | | | |
|---|---|---|---|
| 5,881,078 A | 3/1999 | Hanawa | 714/823 |
| 6,624,677 B1 * | 9/2003 | Wissel | 327/202 |
| 6,668,341 B1 | 12/2003 | Krauch | 714/52 |
| 6,718,494 B1 | 4/2004 | Jamil | 714/723 |
| 6,975,238 B2 | 12/2005 | Schneider | 340/635 |
| 7,482,831 B2 | 1/2009 | Chakraborty | 326/12 |
| 7,506,230 B2 | 3/2009 | Chu | 714/726 |
| 7,546,519 B2 | 6/2009 | Agarwal | 714/823 |

(Continued)

FOREIGN PATENT DOCUMENTS

JP    2007-052596    3/2007

(Continued)

OTHER PUBLICATIONS

"Variation-Tolerant Hierarchical Voltage Monitoring Circuit for Soft Error Detection", Narsale, et al. http://www.ece.rochester.edu/~mihuang/PAPERS/isqed09.pdf.

(Continued)

*Primary Examiner* — Shawki S Ismail
*Assistant Examiner* — Jany Tran
(74) *Attorney, Agent, or Firm* — George Sai-Halasz; Preston J. Young (57) ABSTRACT

A system and method for soft error detection in digital ICs is disclosed. The system includes an observing circuit coupled to a latch, which circuit is capable of a response upon a state change of the latch. The system further includes synchronized clocking provided to the latch and to the observing circuit. For the latch, the clocking defines a window in time during which the latch is prevented from receiving data, and in a synchronized manner the clocking is enabling a response in the observing circuit. The clocking is synchronized in such a manner that the circuit is enabled for its response only inside the window when the latch is prevented from receiving data. The system may also have additional circuits that are respectively coupled to latches, with each the additional circuit and its respective latch receiving the synchronized clocking. Responses of a plurality of circuits may be coupled in a configuration corresponding to a logical OR.

16 Claims, 4 Drawing Sheets

U.S. PATENT DOCUMENTS

| | | | |
|---|---|---|---|
| 7,562,273 B2 | 7/2009 | Chu | 714/726 |
| 2005/0246613 A1* | 11/2005 | Blaauw et al. | 714/763 |
| 2006/0184852 A1 | 8/2006 | Chu | 714/746 |

FOREIGN PATENT DOCUMENTS

| | | |
|---|---|---|
| WO | WO2005041410 | 5/2005 |

OTHER PUBLICATIONS

Das et al., "A Self-Tuning DVS Processor Using Delay-Error Detection and Correction" IEEE JSSC, vol. 41, No. 4, pp. 792-804, (2006).

Das et al., "RazorII: In Situ Error Detection and Correction for PVT and SER Tolerance" IEEE JSSC, vol. 44, No. 1, pp. 32-48, (2009).

* cited by examiner

FIG. 1A  FIG. 1B

PRIOR ART

SOFT ERROR DETECTION FOR LATCHES

CROSS REFERENCE TO A RELATED APPLICATION

This application is a Continuation of application Ser. No. 12/723,189, filed Mar. 12, 2010, which is incorporated herein by reference in its entirety.

GOVERNMENT INTEREST

This invention was made with Government support under Contract B554331 awarded by the Defense Advanced Research Projects Agency (DARPA). The Government has certain rights to this invention.

BACKGROUND

The present invention relates to digital integrated circuits (ICs). In particular, it relates to error detection in such circuits.

As microelectronics arts progress toward ever smaller devices, reliability is an increasing concern. One particular type failure mode in ICs is due to so called soft errors. There is no hardware damage, and the error is non repeatable, or traceable, hence the term "soft". Soft errors may have many causes, but one unavoidable source of such errors is ionizing radiation in the form of alpha particles and cosmic rays.

If a soft error is detected, it may be mitigated in various ways, for instance by repeating the system's operation from some stored and presumably correct state. Soft errors in computation circuits may, however, result in undetected erroneous results. If these undetected errors are frequent enough, the reliability of the entire system may be suspect. In modern processors data from successive pipeline stages of computation is often stored, or latched, to provide inputs to a next pipeline stage. It is thus desirable to be able to detect soft errors that cause latches to change their state.

BRIEF SUMMARY

A system characterized as being a soft error detection system is disclosed. The system includes a circuit coupled to a latch, which circuit is capable of a response upon a state change of the latch. The system further includes synchronized clocking that is received by both the latch and by the circuit. The clocking defines a window in time during which the latch is prevented from receiving data, and the clocking is also enabling the response of the circuit. The clocking is synchronized in such a manner between the latch and the circuit that the circuit is enabled for its response only inside the defined window when the latch is prevented from receiving data. The system may also have additional circuits that are respectively coupled to latches, with each the additional circuit and its respective latch receiving the synchronized clocking. Responses of a plurality of circuits may be coupled in a logical OR configuration.

A method characterized as being a soft error detection method is also disclosed. The method includes coupling a circuit to a latch, and adopting the circuit to respond to a state change of the latch. The method further includes supplying clocking to the latch and to the circuit, and using the clocking to define a window in time during which the latch is prevented from receiving data, and also using the clocking to enable the response of the circuit. The method further includes synchronizing the clocking between the latch and the circuit is in such a manner to enable the response of the circuit only inside the time window during which the latch is prevented from receiving data. The method may also include coupling additional circuits to respective latches, supplying each of the additional circuit and its respective latch with the synchronized clocking, and combining a plurality of the circuit responses in a scheme corresponding to a logical OR.

BRIEF DESCRIPTION OF THE SEVERAL VIEWS OF THE DRAWINGS

These and other features of embodiments of the invention will become apparent from the accompanying detailed description and drawings, wherein.

DETAILED DESCRIPTION

Figure 1A:
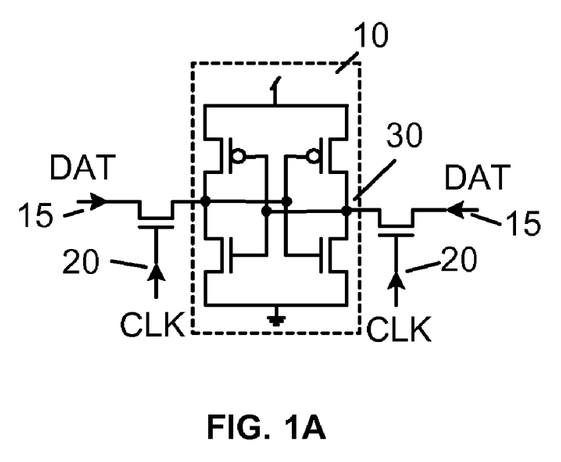
FIGS. 1A and 1B show a prior art representative latch, which latch is susceptible to soft errors.
Figure 1B:
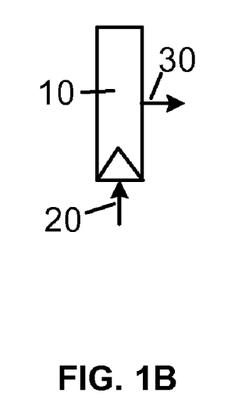

FIG. 1A shows a representative example of a latch 10 that may be susceptible to soft errors. Latches are well known in the electronic arts, they are fundamental building blocks of integrated circuits. If not disturbed, a latch holds its state indefinitely. Consequently, if one observed, for instance, one side of the latch at a trace node 30, the voltage on the node would remain constant. During normal functioning the state of the latch is changed only by data (DAT) arriving through the inputs 15. In a typical integrated circuit (IC) latches are clocked. In the latch 10 shown in FIG. 1A, clocking 20 (CLK) is applied to passgate transistors in the data path 15. Data can enter the latch only when the clocking 20 is in a phase that opens at least one of the passgates. In known nomenclature, the phase when clocking allows data in and out of the latch 10, is called the data phase. When clocking prevents data exchange with the latch, it is called the hold phase, or hold state. The clocking as displayed in FIG. 1A, and its functioning may be representative of many latches, but should not be interpreted in a restrictive manner. Any clocking arrangement that has the capability of preventing the latch from receiving data, and therefore forcing the latch into a hold state, falls within the scope of the embodiments of the present disclosure. Accordingly, henceforth clocked latches will be represented symbolically as shown in FIG. 1B. The latch 10 receives clocking 20 and has a trace node 30. Trace node 30 may be any node of latch 10 on which the voltage is indicative of the state of the latch 10. In a representative embodiment of the invention the trace node 30 may simply be an output node of the latch 10.

The clocking 20 controls whether the internal state of the latch 10 should follow the data input 15 or hold a constant state. If an alpha-particle, cosmic ray, or other type of disturbance induces a state change during the data phase of clocking 20, the data input is likely to change the latch 10 back to the correct state. However, if the state of the latch is changed during the hold state, it will remain in the erroneous state. Depending on particulars of a specific circuits and applications, latches may typically be in the hold state from 50% to over 90% of the time.

Embodiments of the present invention disclose ways of soft error detection with minimal added circuitry in the individual latches themselves, by exploiting the known clocking characteristics of latches. The latch clocking defines a window in time during which the latch is prevented from receiving data, namely when the latch is in a hold state. Embodiments of the disclosure couple an observation circuit to the latch, which circuit responds to a state change of the latch. The observation circuit is also receiving clocking which produces a gating for the circuit response. The clocking of the latch and that of the coupled circuit are synchronized. The circuit is gated in is such manner by the synchronized clocking that the circuit response is enabled only inside the defined time window of the latch hold state. Consequently, the circuit only produces its response if the latch changes state in its supposed hold state. Such a response is a detection of a soft error because it indicates a state change in the latch during a period when it should remain stable. Once a soft error is detected, further actions may be taken at a higher level to correct for the error, such as, for instance, rolling back an execution to the last saved state.

One may implement additional observation circuits, with each circuit respectively coupled to a latch that is being observed. Each additional circuit and its respective latch may receive synchronized clocking, thereby gating the circuit response. A response by any of the observation circuits would indicate a soft error event.

Responses of many circuits may be combined in an observation latch in a scheme corresponding to a logical OR. There may be significantly fewer observation latches than latches observed. Outputs of the observation latches may be further combined to indicate a possible soft error induced state change in a latch located in a particular register, unit, or other design component. These outputs would control other hardware or software components, with the purpose of correcting for the error that occurred.

Clock synchronization between the latch and the circuit may be accomplished is several ways known in the art. In a representative embodiment an additional pulse generator may be added to the local clock block, the one from which the latch clocking may also originate.

Figure 2A:
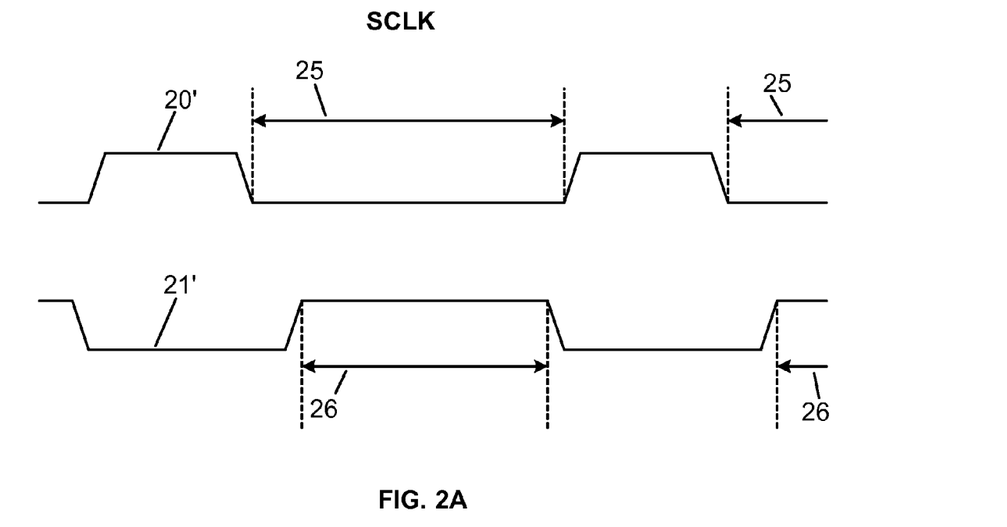
FIGS. 2A and 2B show symbolically a representative synchronized clocking scheme between a latch and an observation circuit.

FIG. 2A shows symbolically a representative synchronized clocking scheme between a latch and an observation circuit. Lines indicated as 20' and 21' show clock voltage waveforms, with line indicated as 20' supplied to the latch and line indicated as 21' supplied to the circuit. Synchronized clocking (SCLK) represents itself in the correlation between the clock voltages. In the latch clock voltage 20' the periods 25 between the dashed lines show the hold phase. When the latch is in the hold state it is prevented from receiving data. These periods 25 define a time window, inside of which, if the latch were to change state it would be an indication of a soft error. The circuit clock voltage 21' is correlated with the latch clock in a manner that the periods 26, when the circuit clock enables a circuit response, are timed to be inside the hold phase windows 25.

The display of the nature of synchronized clocking (SCLK) in FIG. 2A is only a symbolic representation of the voltage values. There are a wide variety of possible realizations of the embodiments of the present invention. Gating of the latch and of the observation circuit may be implemented in many ways, and in which phase are clock voltages high, or low, depend on a variety of choices, many of which would be only peripheral to the embodiments of the present disclosure. The latch clock voltage 20' maybe high, or low, in the hold phase 25, and the circuit clock voltage 21', similarly, may be high, or low, during its enabling phase 26. The voltage of clock signals is indicated with primed numbers, such as 20' for the latch clocking 20, and 21' for the circuit clocking 21. The transitions between high and low voltages of the clocks 20', 21' are shown in FIG. 2A as gradual, again symbolically indicating that voltage transitions have slew rates. Such slew rates in hardware implementations have to be taken in consideration. Accordingly, in an actual IC which implements an embodiment of the disclosure, the time overlap between the latch clock voltage 20' hold phase 25 and the circuit clock voltage 21' enabling phase 26, may also have to allow for considerations that are unrelated to soft errors, such as, for instance, signal quality.

In the following discussions the terms true/false and high/low will interchangeably be used to characterize binary states in the IC. In general, the true/false terminology is logic oriented, and the high/low terminology is more circuit oriented. Usually true is deemed to be associated with high, and false with low. But this is not a necessary connection, since a given logic may have different circuit implementations. What is meaningful is the true/false, high/low state of the various nodes relative to one another, and how a state and/or voltage changes in time.

Figure 2B:
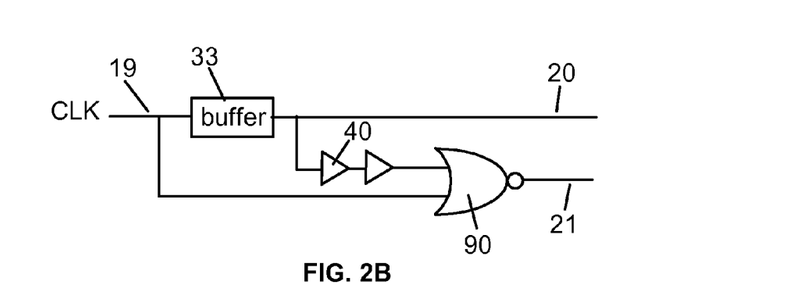

FIG. 2B shows a representative embodiment for implementing the synchronized clocking of a latch and an observation circuit. A circuit, or a block of circuits, may have an overall distributed clock signal. The location where the latch and the observation circuit are placed may be recipient of such a clock signal 19. In a circuit without SER detection the distributed clock signal 19 may go through a buffer 33 and then serve as the latch clocking 20. For generating the circuit clocking 21, one may generate time shifted variants of the clocking supplied to the latch. The time shifted variants may be accepted by a NOR gate 90. The time shifting between the two variants may adjust the relative positions of the hold phase window 25 and the circuit enabling period 26. One of the variants may be tapped off the distributed clock signal 19 in front of the buffer 33, while the other variant after the buffer 33, and possibly adding additional time shifting using an even number of inverters 40. It is known that a NOR gate output is true only if all of its inputs are false. Accordingly, the NOR gate outputs the circuit clocking 21 in the properly synchronized manner, displayed in FIG. 2A as the circuit clock voltage 21'. One skilled in the art may notice that the delay in the rise of circuit clock voltage 21' at the beginning of the enabling period 26 relative to the fall of the latch clock voltage 20' at the beginning of the hold phase window 25 is determined by the delay introduced by the inverters 40. One skilled in the art may also notice that the advanced fall of circuit clock voltage 21' at the end of the enabling period 26 relative to the rise of the latch clock voltage 20' at the end of the hold phase window 25 is determined by the delay introduced by the buffer 33. One skilled in the art may further notice that there may be variations introduced in an actual circuit implementation without changing the concept of synchronization. All such variation are included in embodiments of the present invention.

Symbols presented in this, as well as the other figures of the disclosure, are the customary ones used in the art to depict functional elements of circuits. In FIG. 2B such customary symbols are inverter 40, and NOR gate 90.

Figure 3:
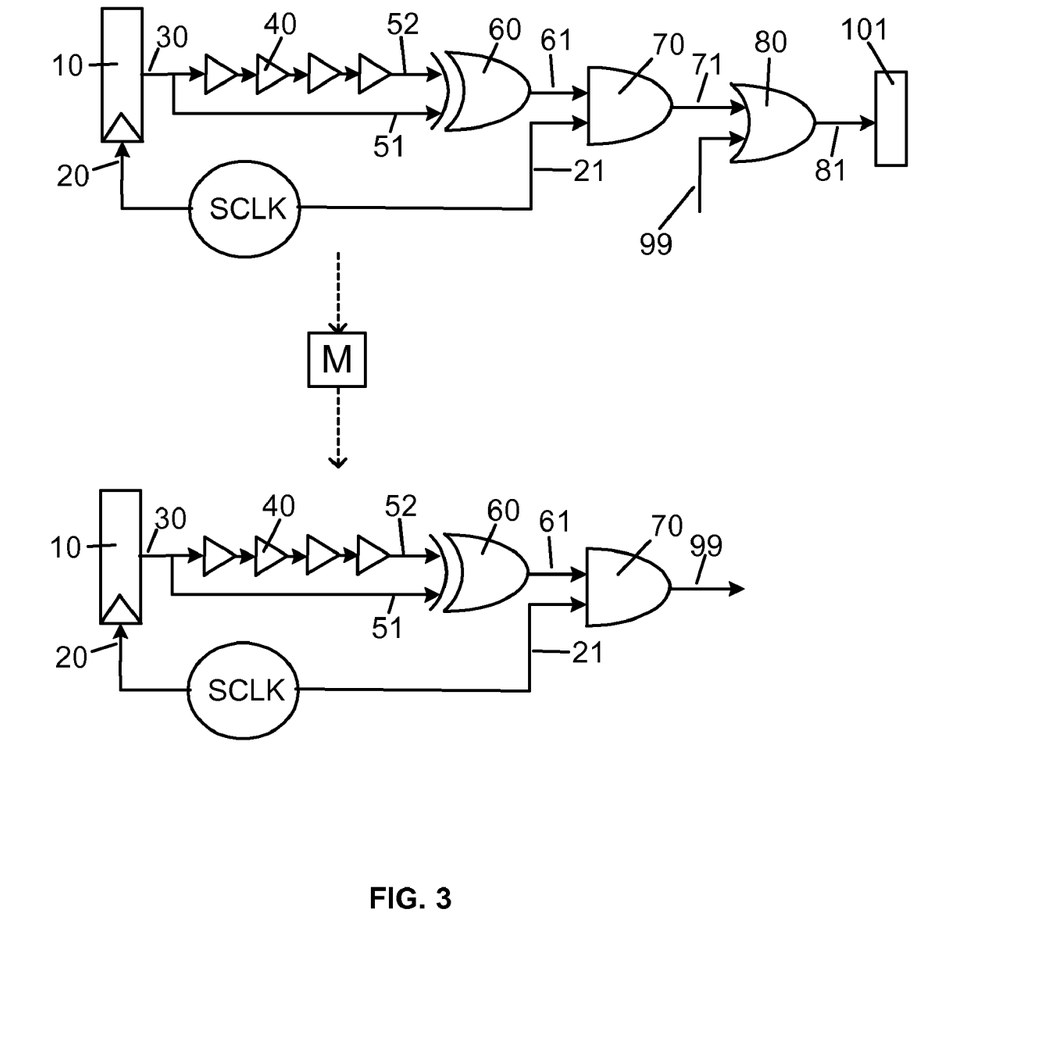
FIG. 3 shows a representative embodiment of soft error detection for a latch.

FIG. 3 shows a representative embodiment of soft error detection for a latch. Further customary symbols presented in FIG. 3 are latch 10, XOR gate 60, AND gate 70, OR gate 80. The arrows indicate the direction of input signals.

The figure is only symbolic, and the figure, and the following discussion of the figure, should not be interpreted in restrictive manner. As it is known in the art, there are a wide variety of possible circuit realizations of the logical elements, such as the XOR, AND, and others. The shown elements represent a certain functionality, but do not specify actual circuit implantation.

As introduced in FIG. 1, latch 10 is the one on which the coupled circuit may detect a possible soft error event. The observation circuit contains a first 51 and a second 52 connection from the latch trace node 30 to an XOR gate 60. The second connection 52 includes a time delay relative to the first connection 51. The time delay may be implemented in the form of a series of inverters 40. The figure shows four inverters 40, but the delay may be implemented with a different number, depending on how much delay is desired. As the first 51 and second 52 connection enter the XOR gate they are not inverted relative to one another, because the number of inverters 40 used for delay in the second 52 connection is selected to be an even number. Thus, in the case of a constant voltage on the latch trace 30, the connections 51, 52, at the point of entering the XOR 60, are either both true, or both false.

If the latch 10 changes state the trace node 30 goes from high to low, or from low to high. If this happens, due to the introduced time delay in the second connection 52, the first 51 and second 52 connections will be inverted relative to one another at the input of XOR 60. This inversion would last approximately for the duration of the introduced delay. As it is known in the art, an XOR gate output is true only if one, but not both, of its inputs are true. Accordingly, a state change of the latch 10 produces the response in the form of a true pulse on the output 61 of the XOR gate 60.

The voltage pulse on the output 61 of the XOR 60, is received as one of the inputs of an AND gate 70. The other input of the AND gate 70 is the synchronized clocking 21. The clocking 21 received by the AND gate 70 is synchronized with the clocking 20 received by the latch 10 in the manner described in reference to FIG. 2A. In FIG. 3, the synchronization of clocking signals 20, 21 is symbolically illustrated by showing them both emerging from a region marked as SCLK. However, as discussed in reference to FIG. 2A, the relation between the clockings 20, 21 is a functional one, without restrictions regarding the manner of their origin.

As it is known in the art, an AND gate produces a true output if all its inputs are true. This means that output 71 of the AND gate 70 is true only when the XOR gate 60 produces a pulse, and the circuit clocking 21 in the true state. Due to the synchronized manner of clocking, the latter happens inside the time window defined by latch clocking 20 as the hold state of the latch. Accordingly, a true pulse on the output 71 of the AND gate 70 is an enabled response of the observing circuit, with the meaning that a latch state change has occurred during a period when the latch 10 was not supposed to have a state change. Thus, a true pulse on the output 71 of the AND gate 70 means that a soft error event occurred in latch 10.

There may be M additional latches that need to be monitored for soft error occurrence. As discussed earlier, such additional latches may also be observed with similar circuits as shown in FIG. 3. The M additional latches and circuits are indicated in FIG. 3 by showing the "M" with arrows and drawing one additional circuit. The response of such M additional observing circuits is shown symbolically as an input line 99 to the OR gate 80, with the understanding that the actual number of such lines may be more than one. How many observation circuits may be connected in this manner depends on practical considerations regarding synchronization. For reliable results, the M observation circuit outputs which are symbolically represented as input 99 to the OR gate 80, may have to arrive within one clock cycle. Such consideration may limit the actual number of lines included in input 99, to the ones served by a single local clock, such as the one represented with input line 19 in FIG. 2B. In typical embodiments, such a number may be less than about 100. As it is known in the art, an OR gate produces a true output if any of its inputs is true. Thus, a true signal on the output 81 of the OR gate 80 may signify that somewhere within the range of the local clock, which includes probably less than 100 latches, a soft error event has occurred.

In an IC, or in a whole processor possibly encompassing multiple ICs, there may be many more latches susceptible to SER, and being monitored by observation circuits. The response of these may not be collectible within one clock cycle. The plurality of responses from a totality of monitoring circuits is represented by the final block 101. It is receiving the OR gate output 81, and symbolically represents hardware involved in the system's action in correcting the error. The first stage of such correcting hardware may be a pulse catching observation latch. And further, possibly through multiple cascading logical OR operations, it may collect all the plurality of observation circuit responses. From the point of view of the logic involved, the plurality of the responses are combined in a scheme corresponding to a logical OR, since, if any of the combined responses is true, it means that somewhere in the totality of the observed IC, or ICs, a soft error occurred. The collection of these responses, and the forming of their logical OR, may proceed in manners known in the art. The word plurality here encompasses all observed latches, and thus it may be anywhere from two, up to many millions, and with miniaturization progressing, it may reach into the hundreds of millions. It is understood that the complexity and function of the system response block 101 depends on the number of observed latches in the IC, or ICs.

The circuit shown in FIG. 3 should be interpreted through its functionality, and not limited by implementation details. One skilled in the art would notice that variations exist, that would give essentially equivalent results. For instance, the order of the AND gate 70 and of the OR gate 80, could be reversed with minor modifications, without altering the soft error detection in the IC.

Figure 4:
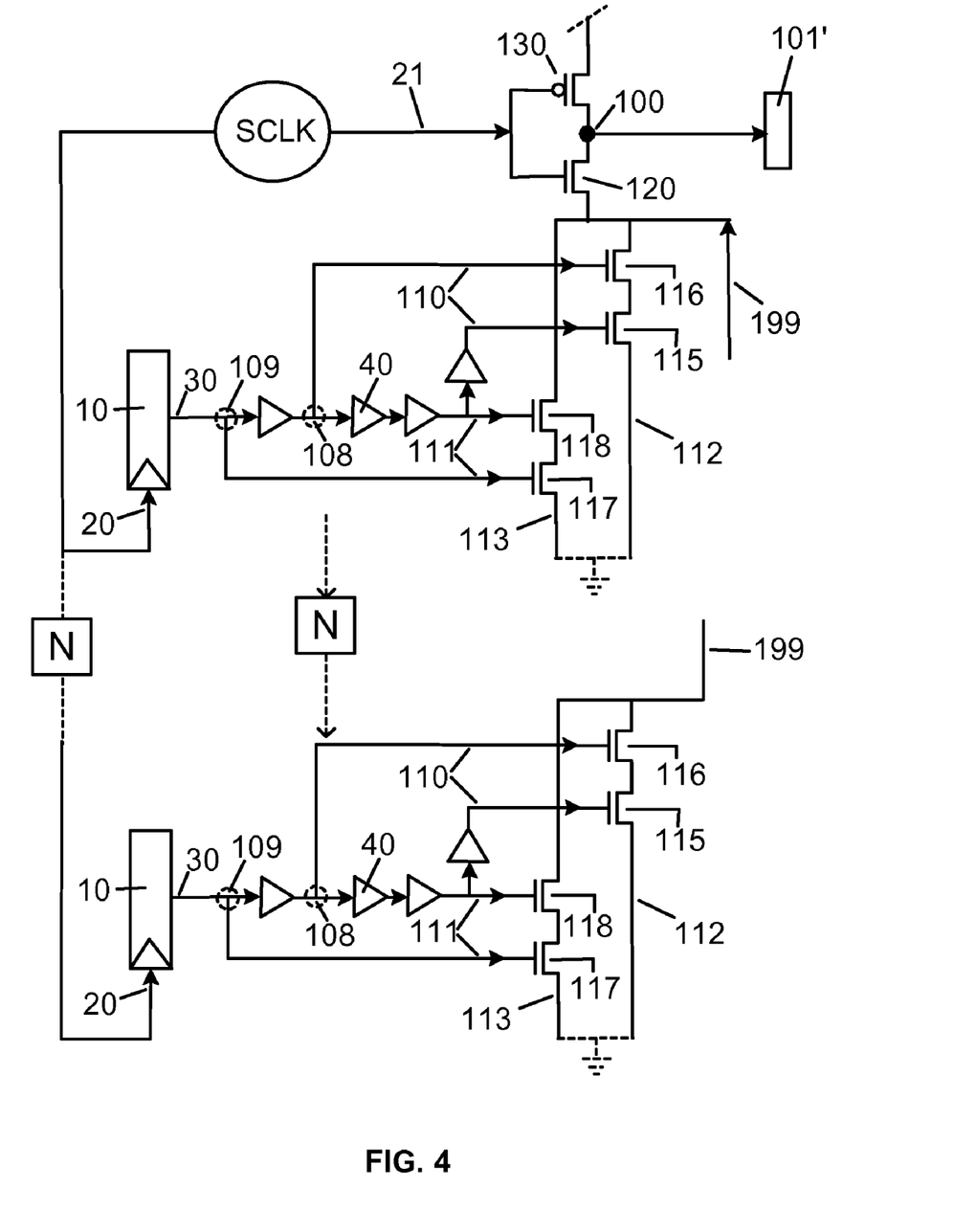
FIG. 4 shows a representative embodiment of soft error detection for a latch involving dynamic implementation.

FIG. 4 shows another representative embodiment of soft error detection for a latch, involving dynamic detection. The discussion referencing the circuit presented in FIG. 4 is mainly given in the terms of high/low, rather than true/false. The present circuit, together with various complex elements, shows individual transistors as well, and transistor operation may be better suited to the circuit oriented high/low nomenclature, than to the logic oriented true/false nomenclature. However, it is again emphasized that FIG. 4, just as the previous figures, should not be interpreted in restrictive manner. One skilled in the art would notice that NFET and PFET transistors could be interchanged, opposite polarities used, and other changes implemented without meaningfully altering the circuit's functioning. And, although the circuit operation is described for the as shown circuit of FIG. 4, all modifications leading to the same function are within the scope of representative embodiments of the invention. It is also understood that in the operation of this circuit, for the practical purposes, when the gate voltage of a PFET is high/low the PFET is essentially closed/open respectively, and conversely, when the gate voltage of an NFET is high/low the NFET is essentially open/closed respectively.

The monitored latch 10 may be generically the same as the previously presented ones, having a clock 20, and being in a state which is observable as a voltage on the trace node 30. The circuit has a node 100, which depending on the state of the circuit clocking 21, may be in a floating state. The latch clocking 20 and circuit clocking 21 are synchronized in the manner presented in FIG. 2A, and indicated here by the clocking lines symbolically emerging from a SCLK marked unit. When the circuit clock 21 is low, during the data phase of the latch 10, the node 100 is charged high, and held high through the PFET 130. When the circuit clock 21 is high, as within the time window of the latch 10 hold phase, the PFET indicated as 130 closes, node 100 floats, and may be pulled down since when the circuit clock 21 is high the NFET indicated as 120 is open.

The linkage of the latch trace node 30 to the floating node 100 commences at the latch trace node 30 with two pairs of connections 110, 111. Each pair of connections 110 and 111 have inversions and delays implemented between the two branches of the pair. These inversions and delays adapt the linkages between the latch 10 and the floating node 100, to discharge the floating node 100 under appropriate circumstances.

With reference to the connection pair indicated as 111, the figure shows that the branch going to the NFET indicated as 118, is inverted and delayed relative to the branch going to the NFET indicated as 117. The figure shows three inverters 40, but this number may be different depending of the desired delay. However, whatever is the absolute number of inverters in the two branches, the difference in the number of inverters between the two branches of pair indicated as 111 is an odd number. This entails the result that if the latch trace node 30 is holding a steady voltage, one of the two inputs, either the one to NFET 117 and or the one to NFET 118 is low, and the potential discharge path 113 is closed.

The connection pair indicated as 110 may be described in essentially the same way as that of connection pair indicated as 111. The branch going to the NFET indicated as 115, is inverted and delayed relative to the branch going to the NFET indicated as 116. The figure shows a difference of three inverters 40 between the two branches, but this number may be different depending of the desired delay. However, whatever is the absolute number of inverters in the two branches, the difference in the number of inverters between the two branches of pair indicated as 110 is an odd number. This entails the result that if the latch trace node 30 is holding a steady voltage, one of the two inputs, either the one to NFET 115 and or the one to NFET 116 is low, and the potential discharge path 112 is closed.

One skilled in the art would notice that the origination points 108, 109 of the two connection pairs 110, 111 should be an odd number of inverters 40 apart, and that inverters that may already exist in the latch 10 may be used to create part of the delays of the two connection pairs 110, 111.

If the latch 10 changes state, and the voltage on the trace node 30 goes, let's say, from low to high, then one can see that for a length of time essentially equaling the introduced delay between the two branches of connection indicated as 111, both NFETs indicated as 117 and 118 will be open, and if NFET indicated as 120 is also open, floating node 100 will be pulled down from high to low through discharge path indicated as 113. Similarly, if the voltage on the trace node 30 goes from high to low, then one can see that for a length of time essentially equaling the introduced delay between the two branches of connection indicated as 110, both NFETs indicated as 115 and 116 will be open, and if NFET indicated as 120 is also open, floating node 100 will be pulled down from high to low through discharge path indicated as 112. Accordingly, the response of this dynamic observation circuit is such that if a state change of either direction occurs in the latch 10 during the time window when the synchronized circuit clock 21 is high, which it is inside the hold phase of the latch 10, then the floating node 100 will be pulled down from high to low. Thus, a discharge of the floating node 100 indicates that a soft error event occurred in latch 10.

In FIG. 4 the ground symbol and high rail symbol are shown with dashed lines, which meant to indicate that the circuit functions as if high and low, namely rail and ground, were so positioned. In actuality there may be further components present between the rail and ground, but these would be transparent in regard to the operation of the circuit as described.

There may be N additional latches that need to be monitored for soft error occurrence. As discussed earlier, such additional latches may also be observed with similar circuits as shown in FIG. 4. The N additional latches and circuits are indicated in FIG. 4 by showing the "N" in the synchronized clocking and with arrows, and by drawing one additional circuit. The response of N such additional observing circuits is shown symbolically as an input line 199 capable to pull down floating node 100, in a logical OR operation. The number of actual response lines that the single input line 199 may represent in an embodiment, follows the reasoning presented in reference to FIG. 3, and input line 99. The discussion also carries over from block 101 of FIG. 3 to the final block 101' here. Block 101' is connected to the floating node 100, and symbolically represents hardware involved in the system's action in correcting the error. Although the logic involved in blocks 101, discussed in reference to FIG. 3, and the logic involved in block 101' is essentially identical, the actual implementation may be different, hence the same indicator number but in a primed manner. From the point of view of the logic involved, block 101' also represents the plurality of the responses combined in a scheme corresponding to a logical OR. Since, if any of the combined responses is true, it means that somewhere in the totality of the observed IC, or ICs, a soft error occurred. The word plurality encompasses all observed latches, and thus it may be anywhere from two, up to many millions, and with miniaturization progressing, it may reach into the hundreds of millions. It is understood that the complexity and function of the system response final block 101' depends on the number of observed latches in the IC, or ICs.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A system, comprising:
 a circuit in a coupling with a latch, wherein said circuit is capable of a response to a state change of said latch, wherein said coupling consists of said circuit receiving input from said latch;
 clocking received by said latch and by said circuit, wherein said clocking is defining a window in time during which said latch is prevented from receiving data, and wherein said clocking provides for said circuit an enabling phase for said response, wherein said clocking is synchronized in such a manner that said enabling phase is timed to be inside said window, wherein said enabling phase has a starting edge and a closing edge, and said starting edge is correlated with the beginning of said window and said closing edge is correlated with the end of said window; and wherein said system is characterized as being a soft error detection system.

2. The system of claim 1, further comprising:

additional ones of said circuit with each said additional circuit respectively coupling to a latch, wherein each said additional circuit is capable of said response to a state change of its said respective latch, wherein each said additional circuit and its said respective latch receive said clocking in said manner of synchronization.

3. The system of claim 1, wherein said latch has a trace node indicative of said state change of said latch, wherein said circuit comprises an XOR gate and further comprises a first and a second connection from said latch trace node to said XOR gate, wherein said first and second connections are non inverting relative to one another, and said second connection provides a delay relative to said first connection, whereby said state change of said latch causes said XOR gate to generate a voltage pulse.

4. The system of claim 3, wherein said circuit further comprises an AND gate, wherein said AND gate receives said voltage pulse from said XOR gate and receives said clocking in said manner of synchronization, wherein said clocking received by said AND gate is in a logical true state only inside said window.

5. The system of claim 1, wherein said latch has a trace node indicative of said state change of said latch, wherein said circuit comprises a floating node and further comprises two pairs of connections from said trace node to said floating node, whereby establishing a linkage between said floating node and said latch, wherein said two pairs of connections comprise inversions and delays and are adapted to discharge said floating node upon said state change of said latch.

6. The system of claim 5, wherein said clocking in said manner of synchronization allows said floating node to be discharged only inside said window.

7. The system of claim 6, wherein said linkage is established between said floating node and a plurality of said latches.

8. The system of claim 1, wherein said manner of synchronization of said clocking comprises:

a NOR gate accepting variants of said clocking received by said latch, wherein said variants are time shifted relative to each another, and wherein said NOR gate outputs said clocking received by said circuit.

9. A method, comprising:

coupling a circuit to a latch, wherein said circuit is adopted for a response to a state change of said latch, wherein said coupling consists of said circuit receiving input from said latch;

supplying clocking to said latch and to said circuit, and using said clocking to define a window in time during which said latch is prevented from receiving data, and using said clocking to provide for said circuit an enabling phase for said response;

synchronizing said clocking in such a manner that said enabling phase is timed to be inside said window, wherein said enabling phase has a starting edge and a closing edge, and correlating said starting edge with the beginning of said window and correlating said closing edge with the end of said window; and wherein said method is characterized as being a soft error detection method.

10. The method of claim 9, further comprising:

coupling additional ones of said circuit to respective latches, wherein each said additional circuit responds to a state change of its said respective latch; and supplying each said additional circuit and its said respective latch with said clocking in said manner of synchronization.

11. The method of claim 9, further comprising:

using a first and a second connection to link a trace node which is indicative of said state change of said latch to an XOR gate, wherein selecting said first and second connections to be non inverting relative to one another and providing a delay in said second connection relative to said first connection, whereby generating a voltage pulse by said XOR gate due to said state change of said latch, and wherein said circuit comprises said first and second connections and said XOR gate.

12. The method of claim 11, further comprising:

receiving in an AND gate said voltage pulse from said XOR gate and said clocking in said manner of synchronization, wherein said clocking received by said AND gate is in a logical true state only inside said window, wherein said circuit further comprises said AND gate.

13. The method of claim 9, further comprising:

using two pairs of connections to link a trace node which is indicative of said state change of said latch to a floating node, wherein selecting said two pairs of connections to comprise inversions and delays and to be adapted to discharge said floating node due to said state change of said latch, wherein said circuit comprises said two pairs of connections and said floating node.

14. The method of claim 13, further comprising:

using said clocking in said manner of synchronization in order to allow said floating node to be discharged only inside said window.

15. The method of claim 14, further comprising:

using said linking between said floating node and a plurality of said latches.

16. The method of claim 9, wherein synchronizing said clocking comprises:

generating time shifted variants of said clocking supplied to said latch; and feeding said variants into a NOR gate, wherein said NOR gate outputs said clocking supplied to said circuit.

* * * * *